United States Patent [19]

Stephens

[11] Patent Number: 5,485,090

[45] Date of Patent: Jan. 16, 1996

[54] METHOD AND APPARATUS FOR DIFFERENTIATING BATTERY TYPES

[75] Inventor: Charles S. Stephens, Corvallis, Oreg.

[73] Assignee: Hewlett-Packard Corporation, Palo Alto, Calif.

[21] Appl. No.: 17,053

[22] Filed: Feb. 11, 1993

[51] Int. Cl.$^6$ .............................. G01N 27/416; H02J 7/04
[52] U.S. Cl. ...................................... 324/433; 320/48
[58] Field of Search ..................................... 324/427, 430, 324/433; 340/636; 320/48; 209/571, 572, 573, 575

[56] References Cited

U.S. PATENT DOCUMENTS

| | | |
|---|---|---|
| 3,723,285 | 3/1973 | Daga et al. . |
| 3,852,652 | 12/1974 | Jasinski . |
| 3,940,679 | 2/1976 | Brandwein et al. . |
| 4,333,149 | 6/1982 | Taylor et al. . |
| 4,363,407 | 12/1982 | Buckler et al. ........................ 209/575 |
| 4,416,957 | 11/1983 | Goebel et al. . |
| 4,423,379 | 12/1983 | Jacobs et al. ........................ 324/430 |
| 4,463,307 | 7/1984 | Kiko et al. . |
| 4,577,144 | 3/1986 | Hodgman et al. .................... 320/48 |
| 4,622,508 | 11/1986 | Matteau et al. . |
| 4,644,245 | 2/1987 | Brown . |
| 4,737,702 | 4/1988 | Koenck . |
| 4,746,852 | 5/1988 | Martin ...................................... 320/20 |
| 5,032,825 | 7/1991 | Kuznicki ................................. 324/427 |
| 5,140,310 | 8/1992 | DeLuca et al. ......................... 340/636 |

FOREIGN PATENT DOCUMENTS

| | | | |
|---|---|---|---|
| 0432689A2 | 6/1991 | European Pat. Off. ........ G01R 31/36 |
| 2648380 | 4/1978 | Germany . |
| 3818034A1 | 11/1989 | Germany ...................... G01R 31/36 |
| 0194377 | 10/1985 | Japan ................................... 324/430 |
| WO92/17791 | 10/1992 | WIPO ............................. G01R 33/12 |

OTHER PUBLICATIONS

"An Evaluation of Commercial Battery Discharge Indicators", M. L. Whitehead, Apr. 1981, 60 pp., ERA Technology Limited, Surrey, England.

Journal Of Applied Electrochemistry, vol. 13, No. 5, Sep. 1983, London GB pp. 577–586, Karunathilaka et al. "The Prediction of The State-of-Charge of Some Commercial Primary Cells".

*Primary Examiner*—Maura K. Regan

[57] ABSTRACT

The cell type of a battery is determined by characterizing the series resistance behavior of various cell types to determine ranges of series resistance values exhibited by batteries of a particular cell type. The series resistance of a battery of unknown cell type is then measured. If the series resistance measurement is determined to be within a range of series resistance values exhibited exclusively by a cell type, the battery is identified as having that cell type. However, for batteries whose series resistance measurements are within a non-exclusive range of series resistance values, a second cell type discharge characteristic such as battery voltage is also characterized to differentiate between the cell types. The second discharge characteristic of these batteries is also measured and used to identify the cell type.

12 Claims, 2 Drawing Sheets

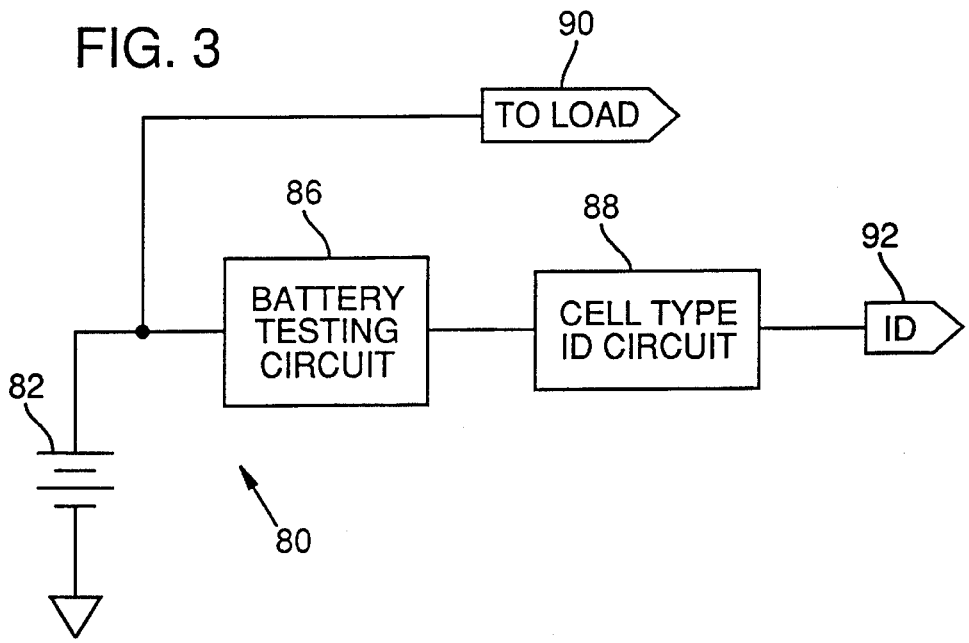
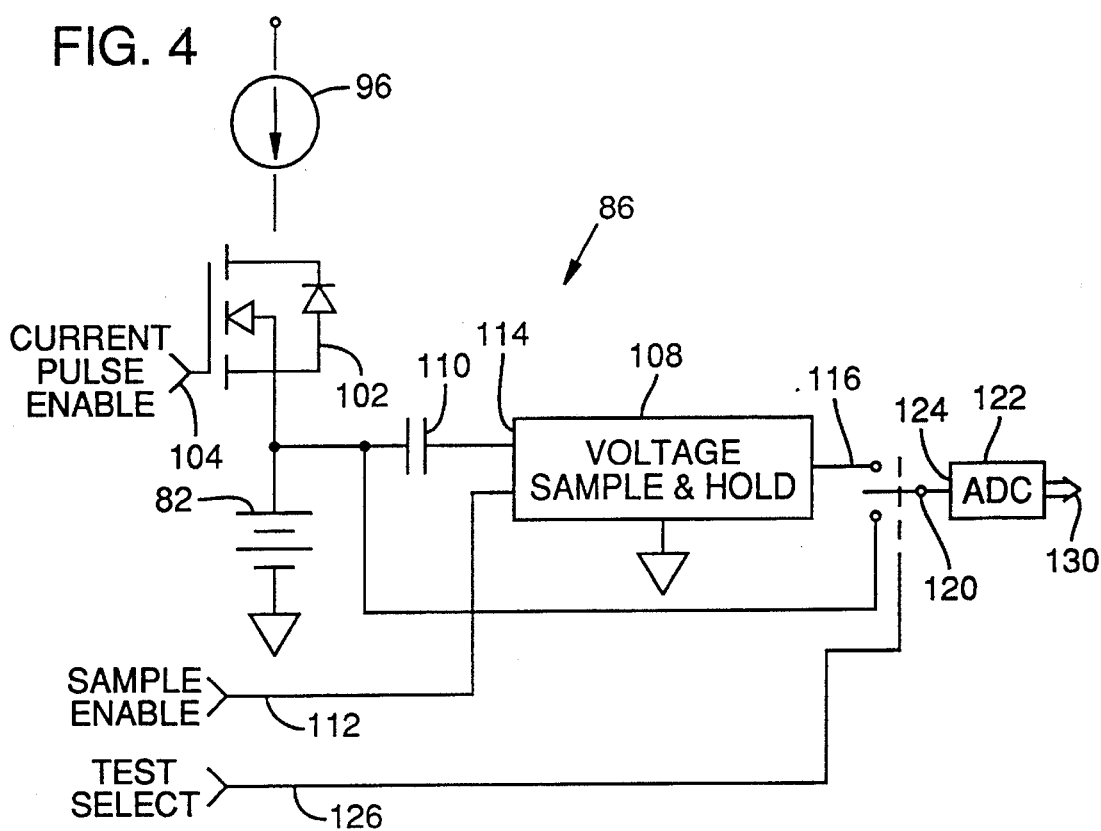

METHOD AND APPARATUS FOR DIFFERENTIATING BATTERY TYPES

FIELD OF THE INVENTION

The present invention relates to a circuit and method for identifying the cell type of a battery, and more particularly relates to a circuit and method for identifying a battery's cell type while in circuit and operating.

BACKGROUND AND SUMMARY OF THE INVENTION

Batteries using various cell technologies (cell types) have been developed and are in widespread use. Two of the most common cell types are alkaline and nickel-cadmium (Ni-Cd). Other cell types include nickel-metal-hydride and various lithium technologies. In many applications., batteries of differing cell types are interchangeable. For example, in many household electronic products such as calculators, palmtop computers and the like, both alkaline and Ni-Cd type batteries can be used.

In some circumstances, however, it is necessary to differentiate between the cell types of the batteries being used in a particular application. For example, in some palmtop computers, an end-of-life or state-of-charge procedure is used to gauge the remaining energy in the battery and provide an indication of same to the user. Typically, these procedures are dependent on the voltage characteristic of the battery over its discharge cycle. Because the voltage characteristic of batteries differs between cell types, the cell type of the battery must be known to accurately gauge the remaining battery energy. If a battery is compared to a voltage characteristic of another cell type, the measurement of the remaining energy will be in error. Improper cell type usage could result in the diagnosis of a fully charged battery as having insufficient remaining charge. The user might prematurely discard or unnecessarily recharge such a misdiagnosed battery. Improper cell type usage could also result in failing to diagnose the impending end of life of a battery with little remaining charge. The user, relying on such diagnosis, could lose valuable data on the eventual failure of the battery.

Cell type differentiation is also critical to battery recharging. Some cell types, such as Ni-Cd, are rechargeable, while others, such as alkaline, are not. If a recharging current is applied to a non-rechargeable battery, the temperature of the battery increases rapidly as does the internal pressure. Eventually, if recharging is continued, the battery will vent, resulting in leakage of caustic chemicals from the battery and possibly an explosion.

Currently, many battery operated products simply rely on the user as directed by an owner's manual or warnings attached to the battery operated product to select and employ-batteries of the proper cell type. Some palmtop computers may even employ user interrogation to identify the cell type prior to gauging the battery's state-of-charge. However, considering the possible consequences of improper cell type usage, it is desirable to have a system to protect the unwary user of a battery operated product from using batteries of the wrong cell type.

Manufacturers of battery operated products have also relied on mechanical lock-out schemes to protect against improper cell type usage. Typical mechanical lock-out devices protect against improper cell type usage by preventing installation of batteries that do not have a particular size, shape or other mechanical feature. Only batteries having the particular mechanical feature can be installed. Typically, the mechanical feature is of non-standard design to ensure that only batteries of the desired cell type have that mechanical feature. However, the use of non-standard batteries usually results in limited availability of suitable batteries to the public. Products employing these schemes may therefore have difficulty in gaining public acceptance. Further, lock-out schemes are not useful to palmtop computer state-of-charge gauges, where the use of interchangeable cell types is desired but the particular cell type in use must be known.

The ability to identify the cell type of a battery while the battery is in use is therefore needed. The present invention provides an apparatus and method for identifying the cell type of a battery while it is in circuit and operating. The invention uses the series resistance of the battery to identify its cell type.

Batteries of different cell types have different discharge characteristics for a particular method of discharge. Most electronics systems use a pulsed, constant power discharge method (i.e., a constant power is intermittently drawn from the battery). Other discharge methods include constant load impedance, constant current, and constant power discharge. It is possible to characterize the behavior of various cell types under a specific discharge method and specific end use. The characteristic behavior of a cell type in a specific use can then be applied to differentiate between cell types.

One particular cell discharge characteristic, the series resistance, is distinct for various cell types under pulsed, constant discharge usage. For example, the series resistance of alkaline batteries falls within a certain range through its life cycle. The series resistance of Ni-Cd batteries, however, falls within a second range of values that, for the most part, is distinct from that of alkaline batteries. The present invention uses this series resistance behavior of batteries to distinguish the cell type.

In accordance with the method of the present invention, the series resistance behaviors of the cell types that may be used in a particular application are characterized to establish the range of values exhibited by the cell types over their lifetimes. Thereafter, the series resistance of a battery in that application is measured and compared to the various ranges associated with the cell types. The battery is then identified as having the cell type associated with the range of values in which its measured series resistance falls.

In the case of some cell types, however, the series resistances of the cell types are not distinct over their full discharge cycle. For example, alkaline and Ni-Cd cell types both exhibit series resistances in a certain intermediate range of values in different portions of their life cycles. In such cases, it is also necessary to use a second discharge characteristic, such as battery voltage, to differentiate between cell types. When the cell types exhibit series resistance values in the intermediate range, the battery voltage or other discharge characteristic of the cell types fall into differing, distinct ranges. Thus, in some embodiments of the invention, the battery voltage or other discharge characteristic of the battery is also measured and compared along with the series resistance to established cell type behaviors to identify the cell type of the battery.

Also in accordance with the present invention, an apparatus for use in an electronic device for identifying the cell type of a battery is provided. The apparatus comprises a battery testing circuit and a cell type identification circuit. In one embodiment of the present invention, the battery test circuit measures the series resistance and voltage of the battery. The testing circuit measures the series resistance of a battery by pulsing the battery with a current pulse of known magnitude and measuring the change in the battery voltage produced by the pulse. The series resistance is the ratio of the voltage change to the magnitude of the current pulse. The testing circuit measures the battery voltage by sampling the voltage and digitizing the sampled voltage.

The cell type identification circuit is preferably embodied in a microprocessor programmed to execute the method of the present invention, but may also be embodied in dedicated hardware. The identification circuit receives the series resistance and voltage measurements from the testing circuit and compares the measurements to established ranges of battery behavior for the cell types. The identification circuit then identifies the battery as being of the cell type associated with the range in which the measurements lie.

Additional features and advantages of the invention will be made apparent from the following detailed description of a preferred embodiment, which proceeds with reference to the accompanying drawings.

BRIEF DESCRIPTION OF THE DRAWINGS

FIG. 3 is a block diagram of a circuit for determining and identifying battery cell type according to a preferred embodiment of the present invention.

FIG. 4 is a block diagram of a battery testing circuit in the circuit of FIG. 3.

DETAILED DESCRIPTION OF THE PREFERRED EMBODIMENT

The preferred embodiment of the present invention distinguishes between two common interchangeable battery cell types, alkaline and Ni-Cd, using a measurement of a battery's series resistance. Before the series resistance measurement can be used to identify the cell type of the battery, it is first necessary to characterize the series resistance behavior of the cell types for a particular discharge method. The series resistance characteristic of the cell types can be determined empirically by observation of a cell type's behavior during discharge or from a battery manufacturer's specifications.

Figure 1:
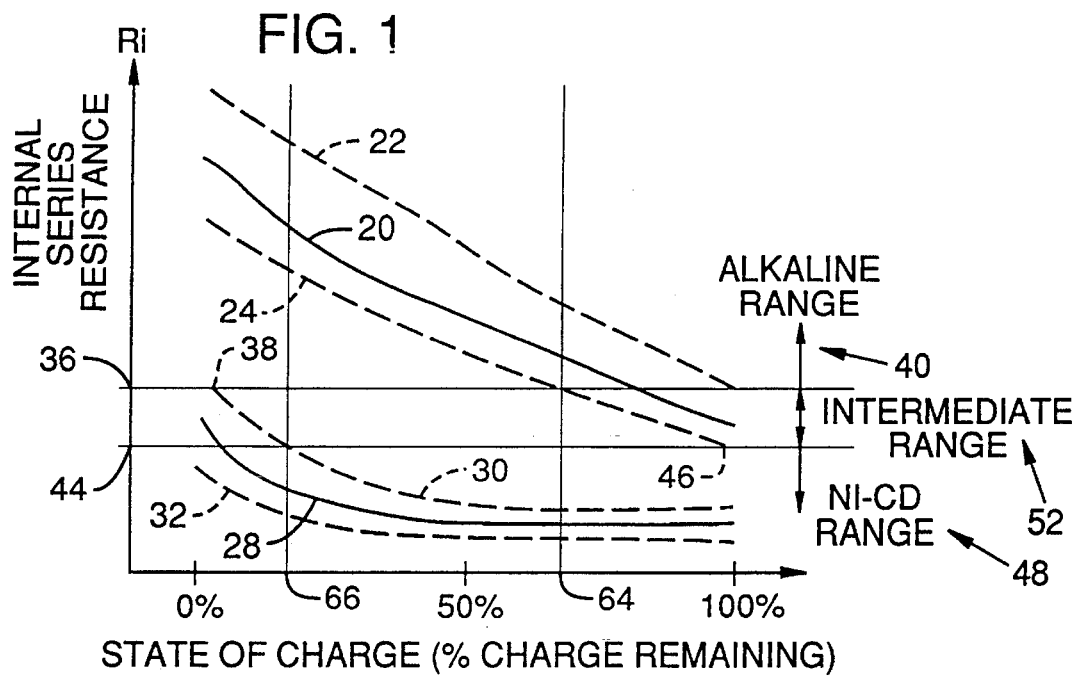
FIG. 1 is a graph of the series resistance of alkaline and Ni-Cd batteries over their charge state profile (percentage remaining charge in the battery).

When subjected to the pulsed, constant power discharge typical of electronic circuits, alkaline and Ni-Cd batteries each have distinct series resistance characteristics. With reference to FIG. 1, the average series resistance of alkaline type batteries as a function of their state-of-charge (measured as a percentage of full charge remaining) graphs as a downward sloping curve 20. The maximum and minimum series resistance values exhibited by alkaline batteries as a function of state-of-charge are shown by downward sloping curves 22, 24 respectively on each side of the average alkaline series resistance curve 20. At any given state-of-charge between empty (0% charge remaining) and fully charged (100% of charge remaining), the series resistance of alkaline batteries falls between the maximum curve 22 and the minimum curve 24.

The average series resistance of Ni-Cd batteries as a function of their state-of-charge is graphed by a second downward sloping curve 28 below the minimum alkaline series resistance curve 24. Ni-Cd batteries exhibit a characteristic series resistance that falls between a maximum Ni-Cd series resistance curve 30 above the average Ni-Cd series resistance curve 28 and a minimum Ni-Cd series resistance curve 32 below the average curve 28.

A next step in the determination of a battery's cell type is to identify ranges of values exhibited exclusively by particular cell types. In the preferred embodiment of the invention, exclusive series resistance ranges are identified for both alkaline and Ni-Cd cell types. In the graph of FIG. 1, a maximum series resistance value 36 exhibited by Ni-Cd batteries is at a point 38 along the maximum Ni-Cd series resistance curve 30 at 0% remaining charge. The series resistance values above the maximum Ni-Cd series resistance value 36 are exhibited exclusively by alkaline batteries. Thus, in the preferred embodiment of the invention, the maximum Ni-Cd series resistance value 36 forms a lower limit of a range 40 of series resistance values exhibited exclusively by alkaline batteries.

A minimum series resistance value 44 exhibited by alkaline batteries lies on the minimum alkaline series resistance curve 24 at 100% charge remaining (point 46). Series resistance values below the minimum alkaline series resistance value 44 are exhibited exclusively by Ni-Cd batteries. The minimum alkaline series resistance value 44 thus forms an upper limit of a range 48 of series resistance values exhibited exclusively by Ni-Cd batteries.

The minimum alkaline series resistance 44 (Ni-Cd range upper limit) is less than the maximum Ni-Cd series resistance 36 (alkaline range lower limit). Between the limits 36, 44 of the alkaline and Ni-Cd ranges is an intermediate range 52 of series resistance values exhibited by both alkaline and Ni-Cd cell types. Alkaline batteries, however, exhibit series resistance values within the intermediate range when at or near full charge, whereas Ni-Cd batteries exhibit series resistance values in the intermediate range when discharged or nearly discharged.

In the preferred embodiment, the cell type of a battery is determined by measuring the series resistance of the battery and comparing the measured series resistance to the limits 36, 44 of the exclusive ranges 40, 48. The battery's series resistance is first compared to the alkaline range lower limit 36. Series resistances greater than the lower limit 36 lie in the alkaline range 40. Therefore, if the battery's series resistance is greater than the lower limit 36, the battery must be alkaline. However, if the battery's measured series resistance is less than the alkaline range lower limit 36, the battery's series resistance is also compared to the Ni-Cd range upper limit 44. Batteries with series resistances less than the Ni-Cd range upper limit 44 (i.e., the series resistance is within the Ni-Cd range 48) are Ni-Cd type batteries.

When the series resistance of the battery lies in the intermediate range 52 (less than the alkaline range lower limit 36 but greater than the Ni-Cd range upper limit 44), the battery could be either alkaline or Ni-Cd. To determine the cell type of a battery having a series resistance within the intermediate range, a further discharge characteristic of alkaline and Ni-Cd batteries must be considered.

In the preferred embodiment of the invention, the voltage characteristic of alkaline and Ni-Cd cell types is used to differentiate between batteries having a series resistance in the intermediate range 52. By characterizing the voltage of alkaline and Ni-Cd batteries whose series resistance falls within the intermediate range, a limit can be determined to differentiate between the cell types.

Figure 2:
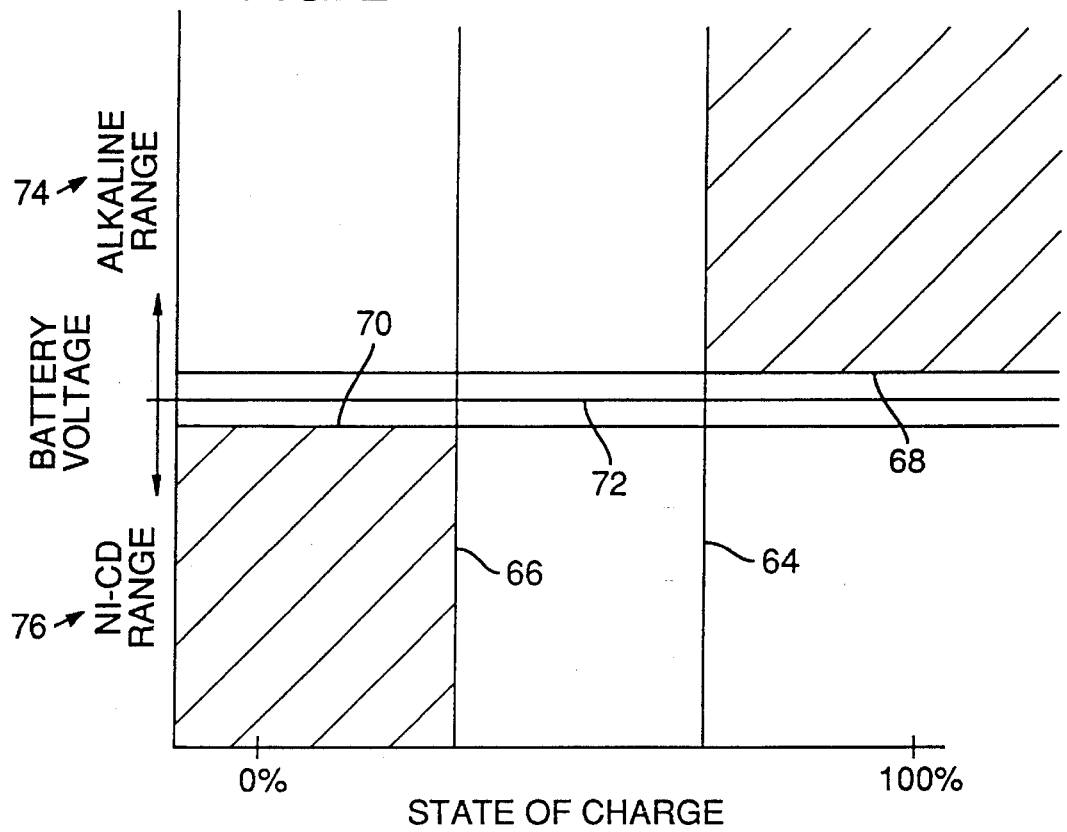
FIG. 2 is a graph of the battery voltage as a function of the percentage remaining charge of alkaline and Ni-Cd batteries whose series resistance is within an intermediate range in the graph of FIG. 1.

With reference to a graph of the battery voltage versus state-of-charge shown in FIG. 2, alkaline batteries having series resistances within the intermediate range 52 (FIG. 1) have a remaining charge greater than a minimum (alkaline) state-of-charge 64 near 100% remaining charge. Ni-Cd batteries, however, with a series resistance in the intermediate range 52 (FIG. 1) have a remaining charge less than a maximum (Ni-Cd) state-of-charge 66 near complete discharge (0% remaining charge). Alkaline batteries whose remaining charge is above the minimum alkaline charge 64 exhibit battery voltages above a minimum alkaline voltage 68. Ni-Cd batteries whose remaining charge is less than the maximum Ni-Cd state-of-charge 66 exhibit battery voltages less than a maximum Ni-Cd voltage 70. The maximum Ni-Cd voltage 70 is below the minimum alkaline voltage 68. Accordingly, in the preferred embodiment of the invention, a battery voltage limit 72 between the maximum Ni-Cd voltage 70 and the minimum alkaline voltage 68 is selected to differentiate between those battery voltages exhibited by alkaline batteries with series resistances in the intermediate range 52 (alkaline voltage range 74) and those battery voltages exhibited by Ni-Cd batteries with series resistances in the intermediate range (Ni-Cd voltage range 76).

The cell type of batteries whose measured series resistance is within the intermediate range 52 is determined using the battery voltage limit 72. When a battery is determined to have a series resistance in the intermediate range, the battery's voltage is also measured. The measured battery voltage is compared to the battery voltage limit 72. Batteries whose measured battery voltage is greater than the battery voltage limit 72 are alkaline type batteries. If, however, the measured battery voltage is less than the battery voltage limit 72, the battery is a Ni-Cd type battery.

Once the cell type of a battery is determined according to this method, the cell type is identified to the user or to another circuit needing the information. For example, the cell type of the battery can be identified to the user by illuminating an LED corresponding to the determined cell type. The cell type can also be identified to another circuit such as a shut-off circuit in a battery recharger by providing a signal corresponding to the determined cell type of the battery being recharged. The shut-off circuit could then prevent recharging of a battery determined to have a non-rechargeable cell type.

Referring to FIG. 3, a circuit 80 for determining the cell type of a battery 82 according to the preferred embodiment of the invention comprises a battery testing circuit 86 and a cell type identification circuit 88. In the illustrated embodiment, the battery 82 is installed in a battery operated product to supply power to a load 90. The circuit 80 is incorporated in the battery operated product to provide an identification of the battery type with an id signal at output 92.

The battery testing circuit 86 is connected to the battery 82 and measures the series resistance and battery voltage of the battery 82. With reference to FIG. 4, the battery testing circuit 86 preferably comprises a constant current source 96 coupled to the battery 82 through a current switch 102. The current switch 102 closes responsive to a current pulse enable signal applied at an input 104 to connect the current source 96 to the battery 82. By applying the current pulse enable signal at the input 104, the battery 82 can be selectively driven with a current of known magnitude supplied by the current source 96.

The battery testing circuit 86 also comprises a conventional voltage sample and hold circuit 108 which is AC coupled to the battery through a capacitor 110. Responsive to a sample enable signal applied at an input 112, the voltage sample and hold circuit 108 samples a voltage at a voltage input 114 and provides the sampled voltage to an output 116. The output 116 is coupled through a switch 120 to an analog to digital converter (ADC) 122. The switch 120 selectively connects an analog voltage input 124 of the ADC 122 to the output 116 of the voltage sample and hold circuit 108 or to the battery 82 responsive to a test select signal applied to an input 126. The ADC 122 provides a digital value at an output 130 corresponding to an analog signal at its input 124.

When measuring the series resistance of the battery 82, the switch 120 is operated to connect the output 116 of the voltage sample and hold circuit 108 to the ADC 122 by applying the test select signal for a series resistance measurement at the input 126. The current pulse enable signal is applied to the input 104 for a short time so that the battery 82 is driven with a current pulse of known magnitude. After the current pulse has stabilized at the known magnitude, the sample enable signal is applied at the input 112. Since the input 114 of the voltage sample and hold circuit 108 is AC coupled to the battery 82, the voltage at the input 114 when the current pulse stabilizes is a difference in the voltage of the battery 82 caused by driving the battery with the current pulse. Thus, when the sample enable signal is applied, the voltage sample and hold circuit 108 samples the battery voltage difference caused by the current pulse. This battery voltage difference is related to the series resistance by the following equation:

$$R = \frac{\Delta V}{\Delta I} \quad (1)$$

where R is the series resistance, delta V is the battery voltage difference, and delta I is the current pulse magnitude. The battery voltage difference is converted to a digital value by the ADC 122 and provided as a scaled measurement of the series resistance at the output 130.

When measuring the voltage of the battery 82, the test select signal is applied at the input 126 to connect the battery 82 to the input 124 of the ADC 122 with the switch 120. The ADC 122 then forms a digital value at the output 130 proportional to the battery voltage.

The cell type identification circuit 88 determines the cell type of the battery 82 from the series resistance and battery voltage measurements according to the method of the present invention. The cell type identification circuit 88 can comprise one or more comparators for comparing the series resistance measurement to the predetermined limits 36, 44 of the alkaline and Ni-Cd ranges 34, 48 and the battery voltage measurement to the battery voltage limit 72. The cell type identification circuit 88 would also comprise a logic circuit for determining the cell type from the comparisons of the measurements to the limits and for forming a digital value corresponding to the cell type at the output 92.

In a preferred embodiment of the invention, however, the circuit 80 is included in a palmtop computer to determine the cell type of the battery 82 prior to gauging the battery's state-of-charge. In such an embodiment, the cell type identification circuit 88 is preferably implemented in software and carried out by the computer's microprocessor. Under control of the software, the microprocessor generates the test select, current pulse enable, and sample enable signals to produce the series resistance and battery voltage measurements with the battery testing circuit 86. The microprocessor then reads the measurements from the battery testing circuit and compares the measurements to the predetermined limits 36, 44, and 72. In accordance with the method of the present invention, the microprocessor then determines a digital value corresponding to the cell type of the battery 82. The cell type value can then be used by the microprocessor in a subsequent state-of-charge gauge procedure.

Having described and illustrated the principles of my invention with reference to a preferred embodiment, it will be recognized that the invention can be modified in arrangement and detail without departing from such principles. For example, in the illustrated embodiment of the invention, a battery's series resistance and voltage measurements are compared to various limits to determine if the measurement is within a range of values exhibited by a particular cell type. In other embodiments of the invention, other means for determining whether a measurement is within a particular range can be used. One such means is a look-up table which associates a plurality of possible measurement values with particular ranges. After measuring the series resistance or battery voltage, the range in which the measurement lies is simply read from the table. The look-up table could be further modified to associate a pair of series resistance and voltage measurements with the cell type of a battery having those measurements.

In a further embodiment, the determination of whether a battery's series resistance and voltage measurements are associated with a particular cell type is made by calculating a function (e.g. the product) of the series resistance and battery voltage measurements and comparing the result to exclusive ranges of the function exhibited by various cell types.

In still other embodiments, pairings of battery characteristics other than the series resistance/voltage described above can be successfully utilized to distinguish battery types. One such alternative characteristic is battery temperature under different operating conditions.

In view of the many possible embodiments to which the principles of my invention may be put, it should be recognized that the detailed embodiments are illustrative only and should not be taken as limiting the scope of my invention. Rather, I claim as my invention all such embodiments as may come within the scope and spirit of the following claims and equivalents thereto.

I claim:

1. A method of determining a battery's type from a plurality of candidate cell types, the battery having positive and negative output voltage terminals, the candidate cell types comprising a first cell type and a second cell type, the method comprising:

measuring the series resistance of the battery between the positive and negative output voltage terminals thereof;

determining whether the series resistance of the battery lies within a predetermined range of series resistance values exhibited by batteries of both the first and second cell types;

when the series resistance of the battery is determined to lie within the predetermined range of series resistance values exhibited by batteries of both the first and second cell types, the method further comprising the steps of:

measuring the voltage of the battery between the positive and negative output voltage terminals thereof;

determining whether the voltage of the battery lies within a first predetermined range of voltages exhibited by batteries of the first cell type whose series resistance is within the predetermined range of series resistance values;

determining whether the voltage of the battery lies within a second predetermined range of voltages exhibited by batteries of the second cell type whose series resistance is within the predetermined range of series resistance values;

identifying the battery as having the first cell type if the series resistance is within the predetermined range of series resistance values and the voltage is within the first range of voltages; and identifying the battery as having the second cell type if the series resistance is within the predetermined range of series resistance values and the voltage is within the second range of voltages.

2. The method of claim 1 comprising:

evaluating the series resistance and battery voltage of the battery;

if the series resistance of the battery exceeds an upper threshold, identifying the battery as having a first cell type;

if the series resistance of the battery is less than a lower threshold, identifying the battery as having a second cell type; and if the series resistance of the battery is between the upper and lower thresholds, and the battery voltage is greater than a voltage threshold, identifying the battery as having the first cell type; and if the series resistance is between the upper and lower thresholds, and the battery voltage is less than the voltage threshold, identifying the battery as having the second cell type.

3. The method of claim 2 wherein the step of measuring the series resistance of the battery comprises:

applying a current differential of a known magnitude to the battery with a constant current source;

measuring a voltage differential of the battery resulting from the applied current differential and thereby related to the series resistance of the battery.

4. An apparatus for differentiating battery cell types, comprising:

battery series resistance testing means connected to voltage output terminals of a battery for determining a series resistance value of the battery by sensing a voltage differential at the voltage output terminals resulting from application of a non-time varying current differential;

battery voltage testing means connected to the voltage output terminals of the battery for determining a voltage value of the battery;

means for determining whether the series resistance value and the voltage value lie within a range of series resistance and voltage values associated with a cell type to identify the battery as being of that cell type.

5. The apparatus of claim 4 comprising:

means for determining whether the series resistance value and the voltage value lie within any of a plurality of ranges of series resistance and voltage values, each range of series resistance and voltage values being associated with a cell type, and for identifying the battery as being of a cell type associated with the range in which the series resistance and voltage values lie.

6. The apparatus of claim 5 wherein the means for determining whether the series resistance value and the voltage value lie within any of a plurality of ranges comprises:

table look-up means for associating a cell type with a plurality of possible series resistance and voltage values.

7. The apparatus of claim 5 wherein the means for determining whether the series resistance value and the voltage value lie within any of a plurality of ranges comprises:

series resistance comparison means for comparing the series resistance value to an upper threshold and to a lower threshold; and voltage comparison means for comparing the voltage value to a voltage threshold;

the series resistance comparison means and the voltage comparison means providing a first indication corresponding to a first cell type when the series resistance value is greater than the upper threshold, providing a second indication corresponding to a second cell type when the series resistance value is less than the lower threshold, and, when the series resistance value is between the upper and lower thresholds, providing the first indication when the voltage value is greater than the voltage threshold and the second indication when the voltage value is less than the voltage threshold.

8. An apparatus for distinguishing between interchangeable candidate cell types of a battery, comprising:

a passive series resistance measurement circuit for providing an indication of a series resistance of the battery without external excitation by sensing a first differential magnitude caused as a result of imposing a non-time-varying second differential of known magnitude to the battery, the series resistance being related to a ratio of a voltage differential to a current differential;

a voltage measurement circuit for providing an indication of a voltage of the battery; and a battery cell type identification circuit in communication with the passive series resistance measurement circuit and the voltage measurement circuit for identifying the cell type of the battery based on the series resistance and voltage indications.

9. The apparatus of claim 8, comprising:

a constant current source for applying a non-time-varying current differential to the battery; and a sampling circuit for sensing a voltage differential caused as a result of the constant current source applying the current differential.

10. The apparatus of claim 9, comprising:

a controller for providing enabling signals to the constant current source and the sampling circuit whereby the sampling circuit senses the voltage differential after the current differential is applied.

11. The apparatus of claim 9, wherein the sampling circuit comprises:

a voltage sample and hold circuit; and a capacitor coupling the sampling circuit to the battery.

12. The apparatus of claim 8 comprising:

the battery cell type identification circuit being operative to compare the series resistance and voltage indications to established, mutually exclusive ranges of series resistance and voltage values exhibited by the candidate cell types, and to identify the battery as being of the cell type within whose exclusive ranges the series resistance and voltage indications fall.

* * * * *

UNITED STATES PATENT AND TRADEMARK OFFICE
CERTIFICATE OF CORRECTION

PATENT NO. : 5,485,090
DATED : January 16, 1996
INVENTOR(S) : Charles S. Stephens It is certified that error appears in the above-identified patent and that said Letters Patent is hereby corrected as shown below:

Column 7,
Line 55, after "within" delete "."

Signed and Sealed this

Seventh Day of September, 2004

JON W. DUDAS
*Acting Director of the United States Patent and Trademark Office*